(12) United States Patent
Kawaguchi et al.

(10) Patent No.: US 9,391,136 B1
(45) Date of Patent: Jul. 12, 2016

(54) SEMICONDUCTOR DEVICE

(71) Applicant: Sanken Electric Co., LTD., Niiza-shi, Saitama (JP)

(72) Inventors: Hiroko Kawaguchi, Niiza (JP); Hiromichi Kumakura, Niiza (JP); Toru Yoshie, Niiza (JP); Shuichi Okubo, Niiza (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 0 days.

(21) Appl. No.: 14/747,212

(22) Filed: Jun. 23, 2015

(30) Foreign Application Priority Data

Mar. 24, 2015 (JP) .................................. 2015-060498

(51) Int. Cl.
*H01L 31/0312* (2006.01)
*H01L 29/06* (2006.01)
*H01L 29/872* (2006.01)

(52) U.S. Cl.
CPC .......... *H01L 29/0619* (2013.01); *H01L 29/872* (2013.01)

(58) Field of Classification Search
CPC ......................... H01L 29/0619; H01L 29/872
See application file for complete search history.

(56) References Cited

U.S. PATENT DOCUMENTS

2015/0060882 A1\* 3/2015 Tarui ...................... H01L 29/36
257/77

FOREIGN PATENT DOCUMENTS

JP 2003-258271 A 9/2003

\* cited by examiner

*Primary Examiner* — Shaun Campbell
(74) *Attorney, Agent, or Firm* — Banner & Witcoff, Ltd.

(57) ABSTRACT

A semiconductor device includes an n-type semiconductor substrate, which has a main surface having an element region and an outer peripheral region surrounding the element region; a p-type guard ring, which includes: a lowly-doped p-type region disposed on an upper surface of the semiconductor substrate in the outer peripheral region surrounding the element region; and a highly-doped p-type region disposed on an inner side of the lowly-doped p-type region and having an impurity concentration higher than an impurity concentration of the lowly-doped p-type region, wherein a side surface and a bottom surface of the highly-doped p-type region are covered by the lowly-doped p-type region such that the highly-doped p-type region is not in contact with the n-type region; and an ohmic junction electrode, which forms an ohmic junction with the highly-doped p-type region.

6 Claims, 8 Drawing Sheets

SEMICONDUCTOR DEVICE

CROSS-REFERENCE TO RELATED APPLICATION

This application claims priority from Japanese Patent Application No. 2015-060498 filed on Mar. 24, 2015, the entire subject matter of which is incorporated herein by reference.

TECHNICAL FIELD

This disclosure relates to a semiconductor device including a guard ring.

BACKGROUND

Silicon carbide (SiC) has a wide band gap and high electric field strength and thus is used as a material of high-power semiconductor devices having high breakdown voltages. For example, Schottky barrier diodes (SBD) which are made of SiC are used for high speed switching. However, in a case of a SBD made of SiC, if a forward current such as a surge current significantly exceeding the rating of the SBD is applied, a forward voltage increases due to substrate resistance, thereby causing an element breakdown. For this reason, various technologies for improving surge current withstand are used.

For example, there has been proposed a structure including a first electrode layer configuring a Schottky junction and a second electrode layer formed separately from the first electrode layer so as to form an ohmic junction with a guard ring disposed around the outer periphery of a SBD region (see Japanese Patent Application Laid-Open No. 2003-258271 for instance). According to this structure, in a case where a forward voltage rises, minority carriers are injected from a PN junction formed by the guard ring which is a p-type region and an n-type drift region into the drift region. The minority carriers diffuse into the drift region positioned below the Schottky junction, whereby conductivity modulation occurs. As a result, the series resistance of the drift region decreases, whereby the forward voltage is suppressed from rising. If the PN junction of the guard ring is operated as a PN diode as described above, it is possible to suppress a breakdown due to a surge current.

However, according to the above described method, in a case where the guard ring and the second electrode layer do not form an ohmic junction, a very high voltage is required for operating as a PN diode. For this reason, the PN junction may not operate as a PN diode until the voltage becomes almost equal to a voltage at which a breakdown may occurs due to the surge current occurs. In this case, forward surge current withstand does not improve. For this reason, in the method disclosed in Japanese Patent Application Laid-Open No. 2003-258271, the second electrode layer is formed of a metal, such as aluminum (Al), gold (Au), platinum (Pt), or an alloy thereof, so as to form an ohmic junction with the guard ring which is an p-type region, and the second electrode layer is formed separately from the first electrode layer which forms a Schottky junction.

SUMMARY

However, a metal or an alloy which can be used for the second electrode layer to form an ohmic junction with the p-type guard ring as disclosed in Japanese Patent Application Laid-Open No. 2003-258271 may react with a metal for a Schottky junction electrode, which is the first electrode layer by heat generation of a Schottky interface of the SBD operating, thereby causing a deterioration in the characteristics of the SBD. Also, in a case of forming an ohmic junction electrode being the second electrode layer before forming the Schottky junction electrode being the first electrode layer, the characteristics of the SBD may deteriorate. That is, there is a possibility that a portion of an Al-based alloy configuring an ohmic junction electrode will disperse due to pre-processing or the like during Schottky junction electrode formation and adhere to the upper surface of a semiconductor substrate pure before the Schottky junction electrode formation, thereby contamination of a Schottky junction interface may be caused. If the Schottky junction interface is contaminated with foreign materials, uniform formation of the Schottky junction is inhibited, and thus the characteristics of the SBD deteriorate. Therefore, problems such as a variation in the Schottky barrier height of the SBD or a deterioration in the forward characteristics occur.

This disclosure provides a semiconductor device capable of suppressing an element breakdown due to a forward current while suppressing degradation in the characteristics.

A semiconductor device includes: an n-type semiconductor substrate, which has a main surface having an element region and an outer peripheral region surrounding the element region; a p-type guard ring, which includes: a lowly-doped p-type region disposed on an upper surface of the semiconductor substrate in the outer peripheral region surrounding the element region; and a highly-doped p-type region disposed on an inner side of the lowly-doped p-type region and having an impurity concentration higher than an impurity concentration of the lowly-doped p-type region, wherein a side surface and a bottom surface of the highly-doped p-type region are covered by the lowly-doped p-type region such that the highly-doped p-type region is not in contact with the n-type region of the semiconductor substrate; and an ohmic junction electrode, which forms an ohmic junction with the highly-doped p-type region.

According to this disclosure, it is possible to provide a semiconductor device capable of suppressing an element breakdown due to a forward current while suppressing degradation in the characteristics.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

Figure 1:
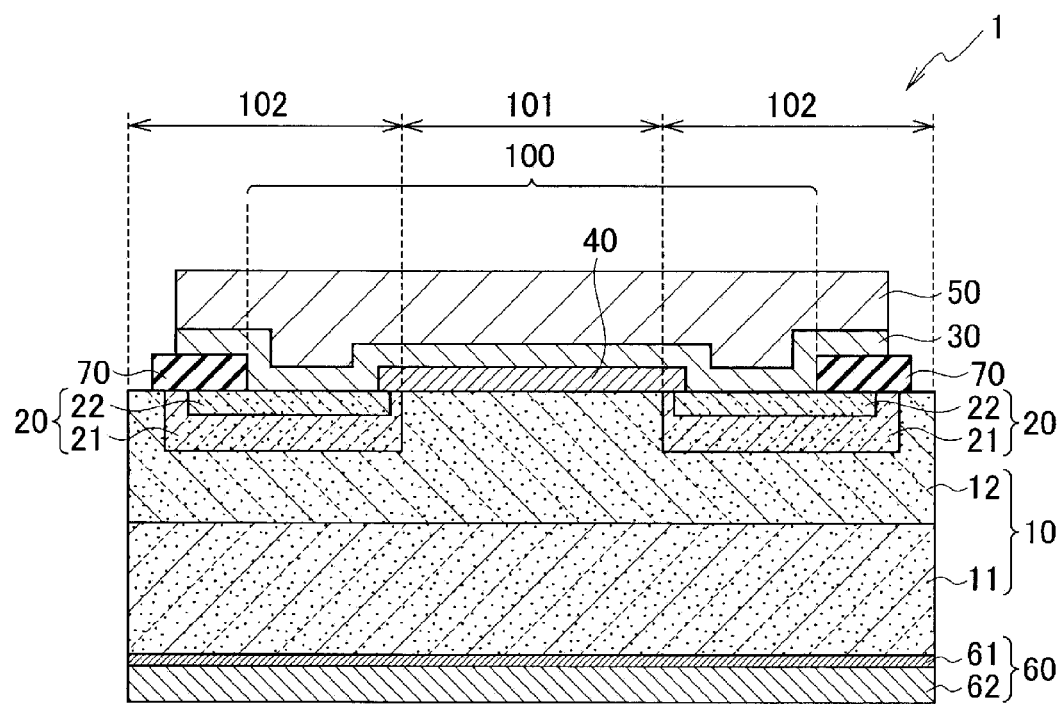
FIG. 1 is a cross-sectional view schematically illustrating a configuration of a semiconductor device according to a first embodiment of this disclosure.

Hereinafter, embodiments of this disclosure will be described with reference to the accompanying drawings. In the following description of the drawings, identical or similar parts are denoted by same or similar reference numerals. However, it should be noted that the drawings are schematic and that the thickness ratio between layers and the like are different from actual ones. Accordingly, specific thicknesses and dimensions should be determined with reference to the following description. Also, it is certain that some portions have different dimensional relations and ratios between the drawings.

Also, the following embodiments show devices and methods to embody the technical ideas of the invention by way of example, and the embodiments of the invention do not limit the materials, shapes, structures, arrangements, and the like of the constituent components to those described below. The embodiments of the invention can be variously modified.

First Embodiment

As shown in FIG. 1, a semiconductor device 1 according to a first embodiment of this disclosure includes: an n-type semiconductor substrate 10 having a main surface in which an element region 101 and an outer peripheral region 102 surrounding the element region 101 are defined; a p-type guard ring 20 disposed in the outer peripheral region 102; and an ohmic junction electrode 30 disposed on the semiconductor substrate 10. In the semiconductor device 1, a semiconductor element is formed in the element region 101. Therefore, the guard ring 20 disposed in the outer peripheral region 102 alleviates electric field concentration in the edge portion of the element region 101. As a result, a breakdown of the semiconductor element due to electric field concentration is suppressed.

The semiconductor substrate 10 has a structure obtained by stacking a lowly-doped n-type semiconductor layer 12 as a drift layer on a highly-doped n-type semiconductor substrate 11. The semiconductor layer 12 is formed continuously over the element region 101 and the outer peripheral region 102. Here, the semiconductor substrate 10 is formed of SiC.

The guard ring 20 includes a lowly-doped p-type region 21 disposed in an annular shape in the upper surface of the semiconductor substrate 10 so as to surround the periphery of the element region 101, and a highly-doped p-type region 22 disposed at the inner side of the lowly-doped p-type region 21 and has an impurity concentration higher than that of the lowly-doped p-type region 21. The side surface and bottom of the highly-doped p-type region 22 are covered by the lowly-doped p-type region 21, whereby the highly-doped p-type region 22 is not in contact with the n-type regions of the semiconductor substrate 10.

The ohmic junction electrode 30 forms an ohmic junction with the highly-doped p-type region 22 of the guard ring 20, thereby being connected to the highly-doped p-type region 22.

The semiconductor device 1 includes a Schottky junction electrode 40 disposed on the upper surface of the semiconductor device 1 so as to form a Schottky junction with the element region 101. The Schottky junction electrode 40 extends to the outer peripheral region 102, such that the edge portion of the Schottky junction electrode 40 is in contact with an element region side portion of the upper surface of the highly-doped p-type region 22 formed in the guard ring 20. As a material for the Schottky junction electrode 40, for example, molybdenum (Mo), titanium (Ti), nickel (Ni), or the like can be used.

In the semiconductor device 1, the ohmic junction electrode 30 is disposed so as to cover the upper surface of the Schottky junction electrode 40. Therefore, at the outer side of the Schottky junction electrode 40, the ohmic junction electrode 30 and the highly-doped p-type region 22 form an ohmic junction.

Also, the main surface (hereinafter, referred to as the "front surface") where the Schottky junction electrode 40 is disposed faces another main surface (hereinafter, referred to as the "rear surface") of the semiconductor substrate 10 on which a rear surface electrode 60 is disposed. The rear surface electrode 60 is made of a layered structure of a first rear surface metal layer 61 which is formed of a metal or a metal compound so as to form an ohmic junction with the semiconductor substrate 10, and a second rear surface metal layer 62 which is made of a metal laminate or the like and serves as a pad. In the rear surface electrode 60, for example, the first rear surface metal layer 61 can be made of a Ni film, a Ni silicide film, or the like, and the second rear surface metal layer 62 can be made of a Ti film, a Ni film, a Pd film, a Ag film, a Au film, or the like.

Meanwhile, on the upper surface of the ohmic junction electrode 30, a pad electrode 50 is disposed so as to cover the front surface of the semiconductor substrate 10. As a material for the pad electrode 50, for example, Al, Ti, Ni, Au, or the like can be used.

That is, a SBD using the pad electrode 50 and the rear surface electrode 60 as an anode electrode and a cathode electrode, respectively, is formed in the element region 101. The guard ring 20 alleviates electric field concentration in the edge portion of the Schottky junction region of the element region 101 due to a reverse voltage which is applied to the anode electrode. As a result, it is possible to suppress a SBD breakdown due to electric field concentration.

The guard ring 20 has a structure in which the highly-doped p-type region 22 is disposed in a portion of the upper portion of the lowly-doped p-type region 21. That is, the side surface and bottom of the highly-doped p-type region 22 are covered by the lowly-doped p-type region 21 such that the highly-doped p-type region 22 is not in contact with the n-type regions of the semiconductor layer 12. As described above, the highly-doped p-type region 22 with crystal defects is insulated from the drift region. Therefore, it is possible to suppress an increase in a leakage current during application of a reverse voltage, as will be described below. At least a portion of the upper surface of the highly-doped p-type region 22 is exposed from the front surface of the semiconductor substrate 10, and in this exposed region, the ohmic junction electrode 30 and the highly-doped p-type region 22 form the ohmic junction.

The impurity concentration of the lowly-doped p-type region 21 is set within a range in which damage of the semiconductor substrate 10 due to impurity implantation during formation of the guard ring 20 does not affect the characteristics of the semiconductor element which is formed in the element region 101. For example, the impurity concentration of the lowly-doped p-type region 21 is set to about $1.0 \times 10^{16}$ atoms/cm$^3$ to $1.0 \times 10^{18}$ atoms/cm$^3$.

Meanwhile, the impurity concentration of the highly-doped p-type region 22 is set such that the contact resistance of the ohmic junction electrode 30 and the highly-doped p-type region 22 forming the ohmic junction is minimized. It is preferable to set the contact resistance of the ohmic junction electrode 30 and the highly-doped p-type region 22 to $1.0 \times 10^{-3}$ Ω·cm$^2$ or less. In this case, the impurity concentration of the highly-doped p-type region 22 is, for example, about $5.0 \times 10^{19}$ atoms/cm$^3$ to $2.0 \times 10^{20}$ atoms/cm$^3$.

In the semiconductor device 1, if a voltage which is applied to a PN junction formed in the contact surface of the guard ring 20 and the drift region which is an n-type region reaches an operating voltage, minority carriers are injected from the PN junction into the drift region. In this case, if the ohmic junction electrode 30 and the highly-doped p-type region 22 of the guard ring 20 form an ohmic junction, carrier injection starts when a forward voltage which is applied to the semiconductor device 1 reaches the operating voltage of the PN junction.

If the minority carriers diffuse into the drift region positioned below the Schottky junction electrode 40, conductivity modulation occurs. Then, the series resistance of the semiconductor device 1 decreases, whereby the forward voltage is suppressed from rising. As a result, it is possible to suppress a SBD breakdown due to a surge current or the like.

Also, the depth and width of the guard ring 20 are set appropriately according to the structure, required breakdown voltage, and the like of the semiconductor device 1.

Figure 2:
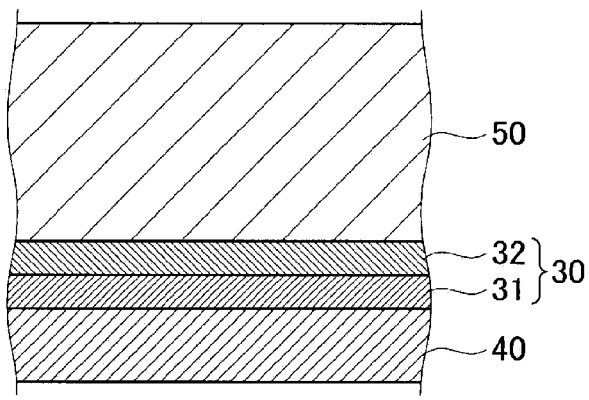
FIG. 2 is a cross-sectional view schematically illustrating an example of a configuration of an ohmic junction electrode of the semiconductor device according to the first embodiment of this disclosure.

Meanwhile, as for the ohmic junction electrode 30, a layered structure of a first diffusion barrier metal layer 31 and a second diffusion barrier metal layer 32 is preferable, as shown in FIG. 2. The first diffusion barrier metal layer 31 is disposed on the upper surface of the Schottky junction electrode 40 and suppresses diffusion of the metal configuring the Schottky junction electrode 40. For example, in a case where the Schottky junction electrode 40 is made of a Mo film, as the first diffusion barrier metal layer 31, a Ni film is used. The first diffusion barrier metal layer 31 forms the ohmic junction with the highly-doped p-type region 22. Also, the second diffusion barrier metal layer 32 is disposed on the first diffusion barrier metal layer 31 and suppresses diffusion of the metal configuring the pad electrode 50. For example, in a case where the pad electrode 50 is made of an Al film, as the second diffusion barrier metal layer 32, a Ti film is used.

In the semiconductor device 1 shown in FIG. 1, an interlayer insulating film 70 is disposed on the outer edge portion of the outer peripheral region 102. The interlayer insulating film 70 is disposed on the upper surface of the semiconductor substrate 10 so as to surround the element region 101. The interlayer insulating film 70 is, for example, a silicon oxide film or the like. On the element region side of the interlayer insulating film 70, the outer edge portion of the guard ring 20 and the interlayer insulating film 70 overlap as seen in a plan view. Hereinafter, the element region 101 and a portion of the outer peripheral region 102 which are not covered by the interlayer insulating film 70 will be referred to as an "active area 100". That is, at the outer side of the active area 100, the upper surface of the semiconductor substrate 10 is covered by the interlayer insulating film 70.

It is preferable that the outer portion of the Schottky junction electrode 40 should overlap a portion of the guard ring 20 positioned in the active area 100 as shown in FIG. 1. By overlapping the edge portion of the Schottky junction electrode 40 and the edge portion of the guard ring 20 inside the active area 100, it is possible to completely suppress exposure of the element region 101 which becomes a Schottky junction interface. Therefore, for example, in a process of manufacturing the semiconductor device 1, after the Schottky junction electrode 40 is formed, the Schottky junction electrode 40 serves as a mask to suppress the front surface of the element region 101 from being etched.

As shown in FIG. 1, the ohmic junction electrode 30 is formed continuously over the highly-doped p-type region 22, a side surface of the interlayer insulating film 70 positioned on the active area side, and the upper surface of the interlayer insulating film 70. By disposing the ohmic junction electrode 30 over the active area 100 and the upper surface of the interlayer insulating film 70, it is possible to completely suppress exposure of the active area 100. As a result, it is possible to suppress water or the like from entering the interface of the active area 100 and the Schottky junction electrode 40 and the interface of the active area 100 and the ohmic junction electrode 30. Also, it is possible to make uniform voltages be applied to the interface of the active area 100 and the Schottky junction electrode 40 and the interface of the active area 100 and the ohmic junction electrode 30.

Also, on the upper surface of the interlayer insulating film 70, it is preferable that the outer edge portion of the ohmic junction electrode 30 should be positioned on the inner side of the outer edge portion of the guard ring 20 as seen in a plan view. This is for suppressing the breakdown voltage of the semiconductor device 1 from decreasing in a case of forming a field liming ring (FLR) at the outer side of the guard ring 20. If the ohmic junction electrode 30 extends onto the FLR, a depletion layer extends beyond its design, thereby causing a decrease in the breakdown voltage. In order to suppress the above, the outer edge portion of the ohmic junction electrode 30 is set on the inner side of the outer edge portion of the guard ring 20.

In manufacturing the semiconductor device 1, in order to form the guard ring 20, p-type impurity implantation is performed in low concentration and p-type impurity implantation is performed in high concentration, at room temperature. Thereafter, activation annealing is performed, whereby the guard ring 20 is formed.

In order to form the ohmic junction of the highly-doped p-type region 22 and the ohmic junction electrode 30, the impurity concentration of the front surface of the highly-doped p-type region 22 needs to reach a concentration necessary for ohmic junction formation. For this reason, the impurity concentration of the front surface of the highly-doped p-type region 22 is adjusted to the maximum by the following method.

First, impurities are implanted into the semiconductor substrate 10 by an ion implantation technique, at room temperature. Subsequently, activation annealing is performed. Thereafter, in order to remove damage of the front surface of the semiconductor substrate 10 subjected to the ion implantation and the activation annealing, a thermal oxide film is formed by a thermal oxidation method. That is, a damage layer of the front surface of the semiconductor substrate 10 is oxidized, thereby becoming an oxide film. Subsequently, the oxide film is removed by wet etching using a mixed solution of hydrofluoric acid.

Next, a thermal oxide film is formed as a lower layer of the interlayer insulating film 70 by thermal oxidation, and a CVD oxide film is formed as an upper layer of the interlayer insulating film 70 on the thermal oxide film by a CVD method. Thereafter, the CVD oxide film and the thermal oxide film on the active area 100 are selectively removed by a photolithography technique and a wet etching technique, whereby the front surface of a region of the semiconductor device 1 corresponding to the active area 100 is exposed.

Here, in the front surface of the semiconductor substrate 10 which is oxidized by thermal oxidation, the front surface of the highly-doped p-type region 22 is thermally oxidized at a speed higher than those of the front surface of the lowly-doped p-type region 21 and the front surface of the semiconductor layer 12, and thus an oxide film which is formed therein by thermal oxidation becomes thick. That is, the position of the front surface of the highly-doped p-type region 22 which is exposed by wet etching retreats into an internal side of the semiconductor substrate 10 from the position of the front surface of the other region of the active area 100. An implantation profile is adjusted in advance such that the impurity concentration in the front surface of the highly-doped p-type region 22 which is exposed after oxide film formation using thermal oxidation and oxide film removal becomes a concentration to form an ohmic junction with the ohmic junction electrode 30. Also, before formation of the ohmic junction electrode 30, a natural oxide film formed on the front surface of the highly-doped p-type region 22 is removed by dry etching. In this case, the implantation profile is also adjusted such that the front surface of the highly-doped p-type region 22 is slightly etched so as to retreat.

For example, according to an implantation profile in which the concentration of the front surface of the highly-doped p-type region 22 during impurity implantation is $2.0 \times 10^{20}$ atoms/cm$^3$, and the impurity concentration at a depth of 50 nm in the semiconductor substrate from the front surface is $10 \times 10^{20}$ atoms/cm$^3$, ion implantation is performed. This is because the front surface of the highly-doped p-type region 22 retreats to the depth of 50 nm in the semiconductor device 1 from its position during impurity implantation due to oxide film formation using thermal oxidation for damage removal, oxide film removal using wet etching, formation of an oxide film to be the interlayer insulating film 70, removal of the oxide film of the active area 100 by wet etching, and dry etching which is performed before formation of the ohmic junction electrode 30. According to the above described implantation profile, a position having a concentration of $10.0 \times 10^{20}$ atoms/cm$^3$ is exactly exposed from the front surface. Also, the lowly-doped p-type region 21 has a flat implantation profile having an implantation concentration of $10.0 \times 1018$ atoms/cm3 with respect to a depth direction of a depth of about 1 μm, and thus the position of the front surface of the lowly-doped p-type region 21 does not retreat due to oxidation. Further, the oxidation speeds of un-implanted regions which are the lowly-doped p-type region 21 and the semiconductor device 1 become almost equal.

Figure 3:
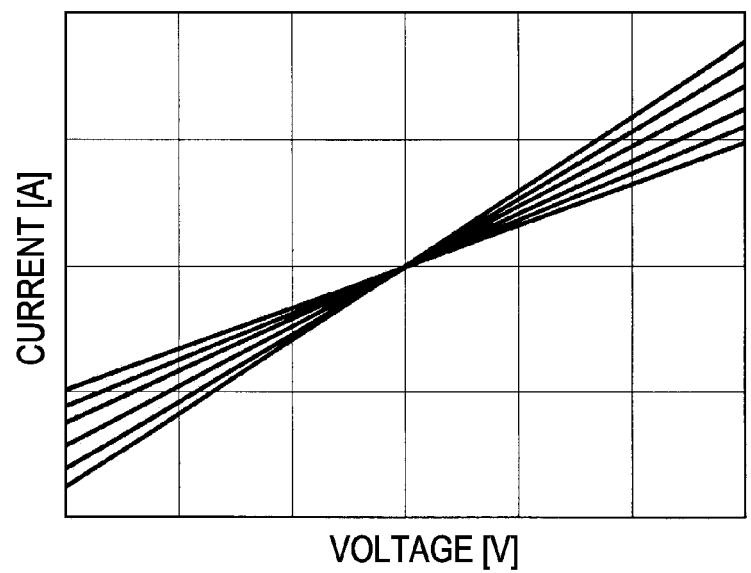
FIG. 3 is a graph illustrating TLM measurement results of the semiconductor device according to the first embodiment of this disclosure.
Figure 4:
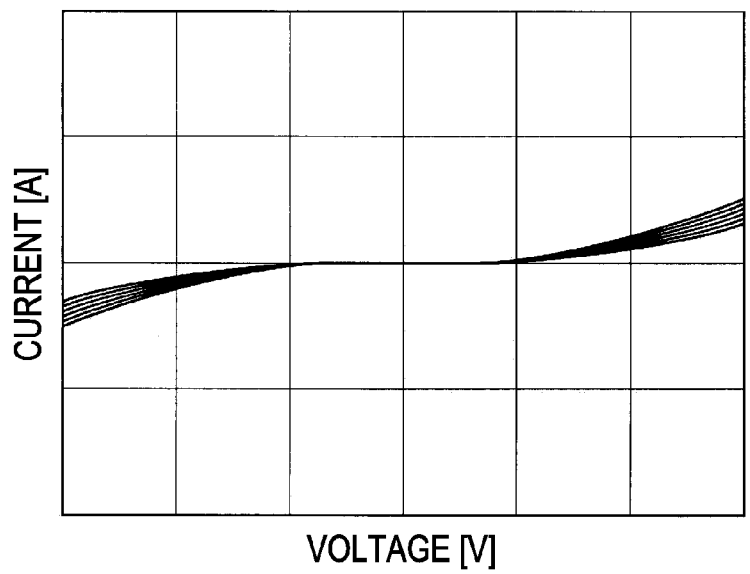
FIG. 4 is a graph illustrating TLM measurement results of a semiconductor device which is a comparative example.

As a comparative example, TLM measurement results in a case where an ohmic junction is formed by the highly-doped p-type region 22 and the ohmic junction electrode 30 will be shown below. FIG. 3 shows measurement results in a case where the concentration of the front surface of the highly-doped p-type region 22 is $1.0 \times 10^{20}$ atoms/cm$^3$. Since each plot of current against voltage is linear, and a resistance value is fixed against TLM electrode intervals, it can be understood that there is an ohmic junction. In this case, the contact resistance between the highly-doped p-type region 22 and the ohmic junction electrode 30 is from $5.0 \times 10^{-4}$ Ω·cm2 to $1.0 \times 10^{-3}$ Ω·cm2.

Typically, in order to form a p-type SiC region such as the guard ring 20 in the n-type semiconductor substrate 10, an ion implantation technique, an epitaxial growth technique, or the like with using p-type impurities of boron (B), aluminum (Al) or the like is used. In general, after ion implantation is performed, ions are activated by heat treatment at 1500° C. or higher in an inert atmosphere, whereby a p-type region is formed.

Also, as a material of a metal film configuring an ohmic junction with the p-type SiC region, Al-based alloys which are made of Al, Ti, Ni, and the like, Ti silicide, Ni silicide, gold (Au), platinum (Pt), or the like can be used. These metals and the metal compounds are reacted with the p-type SiC region by heat treatment, whereby an ohmic junction is formed or ohmic resistance decreases.

In this case, if the impurity concentration of the p-type region to come into contact with a metal is made $5.0 \times 10^{19}$ atoms/cm$^3$ or higher, it is possible to form an ohmic junction only by bringing an Ni film in contact with the p-type region. However, if the entire guard ring 20 is made a p-type region having a high concentration of $5.0 \times 10^{19}$ atoms/cm$^3$, forward leakage current increases as will be described below. It is empirically known that, if impurities are implanted into the semiconductor substrate 10 in a high concentration, it is impossible to completely suppress implantation damage of the semiconductor substrate 10 even if a countermeasure such as high temperature implantation is taken. After impurity implantation, the semiconductor substrate 10 contains many defects due to the implantation. These defects disturb formation of a uniform depletion layer between the p-type region and the drift region and acts as a leakage current path during application of a reverse voltage. Therefore, leakage current from the vicinities of the defects increases and reverse characteristics deteriorate remarkably.

In the semiconductor device 1 shown in FIG. 1, in order to suppress damage of the semiconductor substrate 10 due to ion implantation, the lowly-doped p-type region 21 having a low impurity concentration is formed in a region where the guard ring 20 and the drift region are in contact with each other. Meanwhile, the highly-doped p-type region 22 is formed at the inner side of the guard ring 20 so as to be completely separated from the drift region.

As a result, the highly-doped p-type region 22 and the ohmic junction electrode 30 form an ohmic junction, whereby the guard ring 20 and the ohmic junction electrode 30 are electrically connected. Further, since the highly-doped p-type region 22 included in the guard ring 20 and having many crystal defects is completely separated from the drift layer by the lowly-doped p-type region 21, it is possible to suppress an increase in leakage current during application of a reverse voltage.

Figure 5:
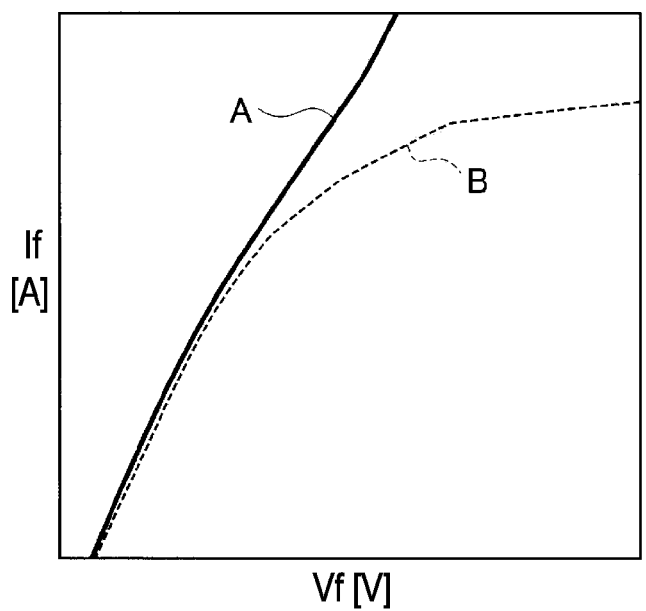
FIG. 5 is a graph illustrating forward characteristic measurement results.

FIG. 5 shows plots of forward current against forward voltage in a SBD(A) which has the lowly-doped p-type region 21 and the highly-doped p-type region 22 of the guard ring 20 and the ohmic junction electrode 30, and a SBD(B) which has only the lowly-doped p-type region 21 and the ohmic junction electrode 30. In the SBD(A) having the lowly-doped p-type region 21, the highly-doped p-type region 22 and the ohmic junction electrode 30, rising of voltage in a region where an amount of forward current IF is large is suppressed as compared to the SBD(B) having only the lowly-doped p-type region 21 and the ohmic junction electrode 30. That is, in the SBD(A) having the lowly-doped p-type region 21, the highly-doped p-type region 22, and the ohmic junction electrode 30, when a forward surge current is applied, the voltage is suppressed from rising, and the forward surge current withstand of the semiconductor device 1 is improved.

Hereinafter, a method of manufacturing the semiconductor device 1 according to the first embodiment of this disclosure will be described with reference to the accompanying drawings. Also, it is certain that the method of manufacturing the semiconductor device 1 to be described below is an example and can be implemented by modifications thereof and various other manufacturing methods.

Figure 6:
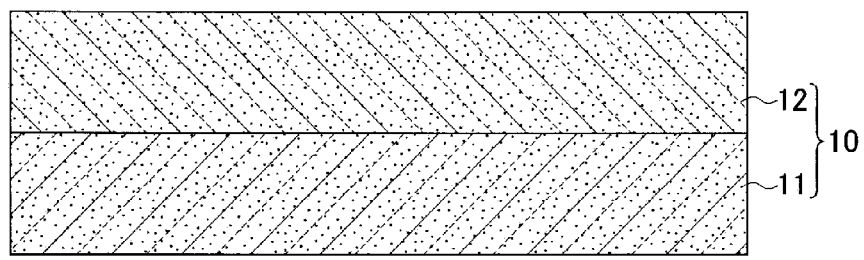
FIG. 6 is a schematic cross-sectional view for explaining a first process of a method of manufacturing the semiconductor device according to the first embodiment of this disclosure.

First, as shown in FIG. 6, the n-type semiconductor layer 12 is formed on the n-type semiconductor substrate 11 made of SiC, whereby the semiconductor substrate 10 is formed. For example, the semiconductor substrate 11 is an n-type SiC substrate having substrate resistivity of about 0.02 Ω·cm, and the semiconductor layer 12 is an SiC semiconductor layer formed on the semiconductor substrate 11 by epitaxial growth so as to have a thickness of 5 μm to 10 μm and having an impurity concentration of about $5.0 \times 10^{15}$ atoms/cm$^3$ to $15.0 \times 10^{15}$ atoms/cm$^3$.

Figure 7:
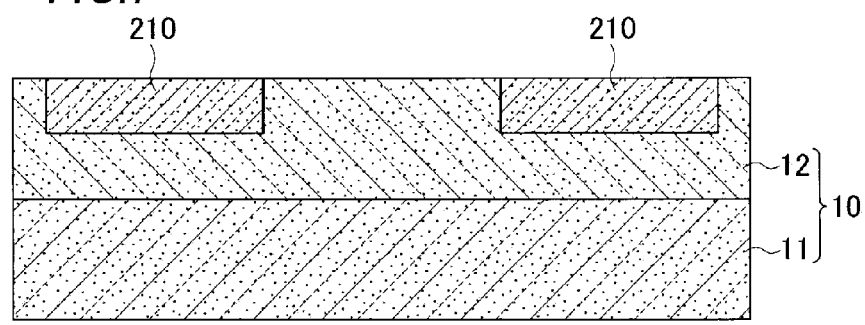
FIG. 7 is a schematic cross-sectional view for explaining a second process of the method of manufacturing the semiconductor device according to the first embodiment of this disclosure.

Subsequently, on the upper surface of the semiconductor substrate 10, an implantation through oxide film (not shown) is formed. Thereafter, p-type impurities are implanted into a guard ring (20) formation region by using, as a mask, a photoresist film formed on the implantation through oxide film and patterned to have a hole at an implantation portion. As a result, a lowly-doped p-type region 210 is formed as shown in FIG. 7. For example, p-type impurities of Al or the like are implanted into a portion of the upper portion of the semiconductor layer 12 at room temperature. Thereafter, the photoresist film used as the ion implantation mask is removed.

Also, an FLR (not shown) may be formed at the outer side of the guard ring 20 such that the semiconductor device 1 has a desired breakdown voltage. The FLR can be formed in the same process as that of the guard ring 20. However, the impurity implantation conditions of the guard ring 20 and the FLR may differ depending on the structure of the semiconductor device 1. Also, patterning of the mask for implantation and impurity implantation may be performed in separate processes by the guard ring 20 and the FLR.

Figure 8:
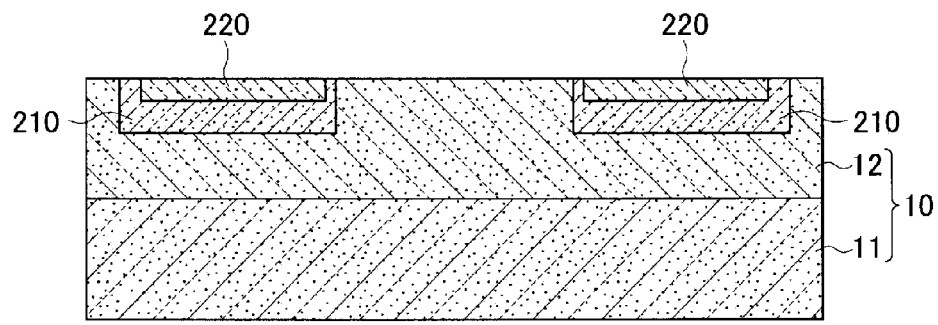
FIG. 8 is a schematic cross-sectional view for explaining a third process of the method of manufacturing the semiconductor device according to the first embodiment of this disclosure.

Subsequently, into the lowly-doped p-type region 210, p-type impurities to form the highly-doped p-type region 22 are implanted. For example, p-type impurities of Al or the like are implanted into a portion of the upper portion of the lowly-doped p-type region 21 at room temperature by using a photoresist film newly formed on the implantation through oxide film and patterned to have a hole at an implantation portion. That is, as shown in FIG. 8, a highly-doped p-type region 220 is formed at the inner side of the lowly-doped p-type region 210. In this case, the side surface and bottom of the highly-doped p-type region 220 are covered by the lowly-doped p-type region 210, whereby the highly-doped p-type region 220 is not in direct contact with the n-type region of the semiconductor layer 12. Thereafter, the photoresist film used as the mask for ion implantation and the implantation through oxide film are removed.

Although it has been described above an example in which the lowly-doped p-type region 210 is formed, and then the highly-doped p-type region 220 is formed, the highly-doped p-type region 220 may be formed before formation of the lowly-doped p-type region 21. Also, as the mask for impurity implantation, a mask other than a photoresist film, for example, a hard mask such as an oxide silicon mask may be used.

Next, the guard ring 20 is formed by activation annealing. For example, a solvent made of carbon, hydrogen, and oxygen is applied onto the semiconductor substrate 10 and is baked, or a carbon layer is formed by a physical vapor deposition (PVD) method or a chemical vapor deposition (CVD) method. Thereafter, heat treatment is performed at 1600° C. to 2000° C. for one minute to 15 minutes in an inert atmosphere of argon (Ar) or the like, whereby the implanted p-type impurities are activated. As a result, the guard ring 20 having the highly-doped p-type region 22 surrounded by the lowly-doped p-type region 21 is formed in the outer peripheral region 102 of the semiconductor substrate 10. Thereafter, the carbon layer is removed by oxidation.

Next, the damage layer on the semiconductor substrate 10 is oxidized by thermal oxidation, and is removed by wet etching.

Figure 9:
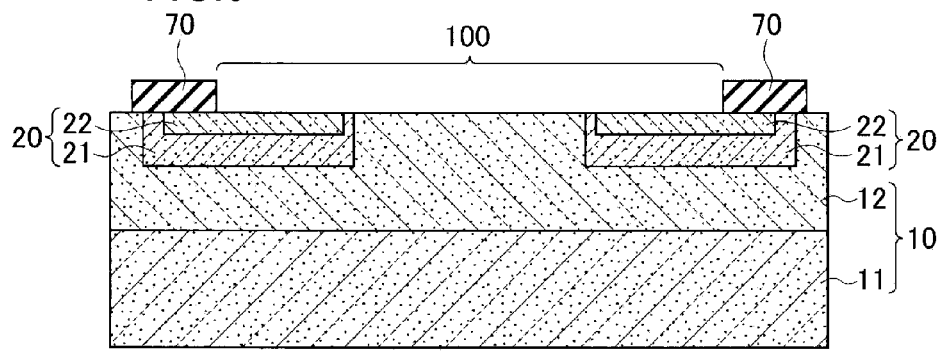
FIG. 9 is a schematic cross-sectional view for explaining a fourth process of the method of manufacturing the semiconductor device according to the first embodiment of this disclosure.

Subsequently, a thermal oxide film is formed as the interlayer insulating film 70 on the semiconductor substrate 10, and then an insulating film is formed on the thermal oxide film by a CVD method or the like. Examples of that insulating film include a silicon oxide film, a silicon nitride film, an NSG film, and a PSG film. The thermal oxide film and the insulating film are patterned by a photolithography technique and an etching technique, whereby the interlayer insulating film 70 is formed as shown in FIG. 9 such that the upper surface of the semiconductor substrate 10 of the active area 100 is exposed. In this case, the concentration of the front surface of the highly-doped p-type region 22 to be exposed is set to $5.0 \times 10^{19}$ atoms/cm$^3$ or higher. Since the thermal oxide film retreats into the substrate, the previous ion implantation condition is selected such that the concentration at the position of the retreated front surface becomes a target concentration.

Figure 10:
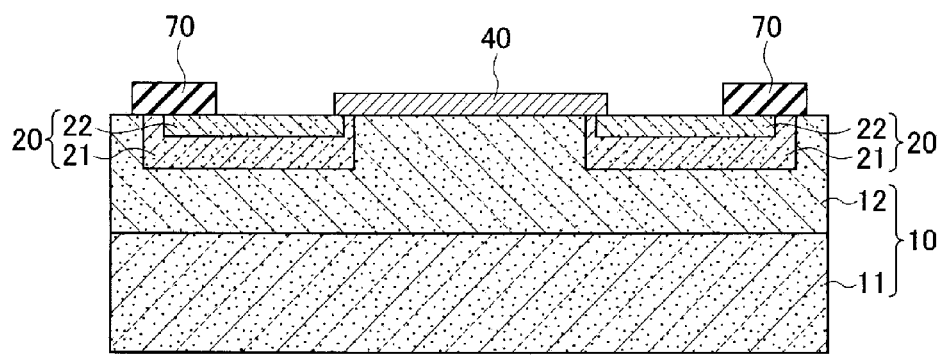
FIG. 10 is a schematic cross-sectional view for explaining a fifth process of the method of manufacturing the semiconductor device according to the first embodiment of this disclosure.

Next, as the Schottky junction electrode 40, for example, a MO film with a film thickness of 50 nm to 200 nm is formed in the element region 101 inside the active area 100. After metal film is formed, and then the MO film is patterned by a photolithography technique, a wet etching technique, and the like, whereby the Schottky junction electrode 40 is formed. In this case, as shown in FIG. 10, the edge portion of the Schottky junction electrode 40 is disposed so as to overlap a portion of the highly-doped p-type region 22 of the guard ring 20. Next, heat treatment is performed at 600° C. to 650° C. in an inert atmosphere gas or a reducing atmosphere gas for 5 minutes to 30 minutes, whereby the semiconductor substrate 10 and the Schottky junction electrode 40 are reacted to form a Schottky junction.

Thereafter, etching is performed on a region, which is positioned on the semiconductor layer 10 in the active area 100 and does not include the Schottky junction electrode 40, that is, the exposed region of the highly-doped p-type region 22 by reverse sputtering or dry etching. As a result, a natural oxide film formed on the upper surface of the highly-doped p-type region 22, unnecessary materials, and the like are removed such that the front surface of the highly-doped p-type region 22 becomes a state appropriate to form an ohmic junction. Also, in a case where the concentration of the front surface of the highly-doped p-type region 22 has not reached a target position on the implantation profile, reverse sputtering and dry etching are performed until the corresponding concentration reaches the target position, whereby the front surface having a high concentration is exposed. For example, dry etching of 1000 W to 2000 W is performed in an argon (Ar) atmosphere for several minutes. In this case, since the interlayer insulating film 70 and the Schottky junction electrode 40 act as a mask, the front surface of the semiconductor substrate 10 other than the highly-doped p-type region 22 having the exposed front surface is not etched.

Figure 11:
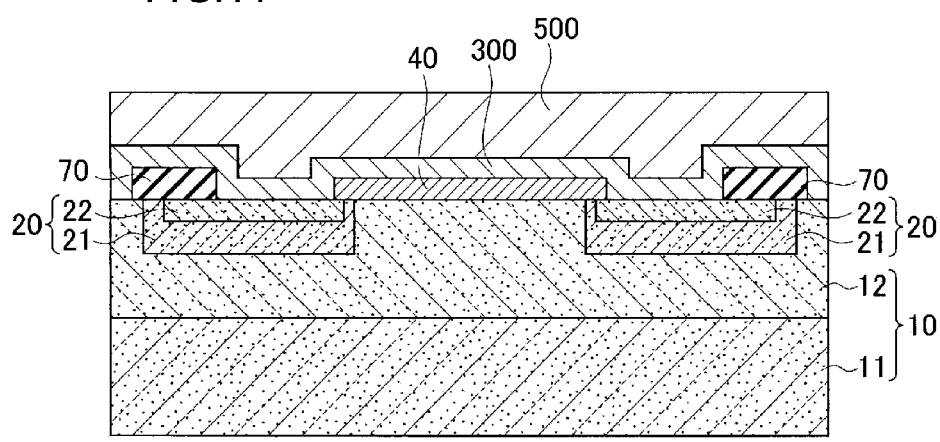
FIG. 11 is a schematic cross-sectional view for explaining a sixth process of the method of manufacturing the semiconductor device according to the first embodiment of this disclosure.
Figure 12:
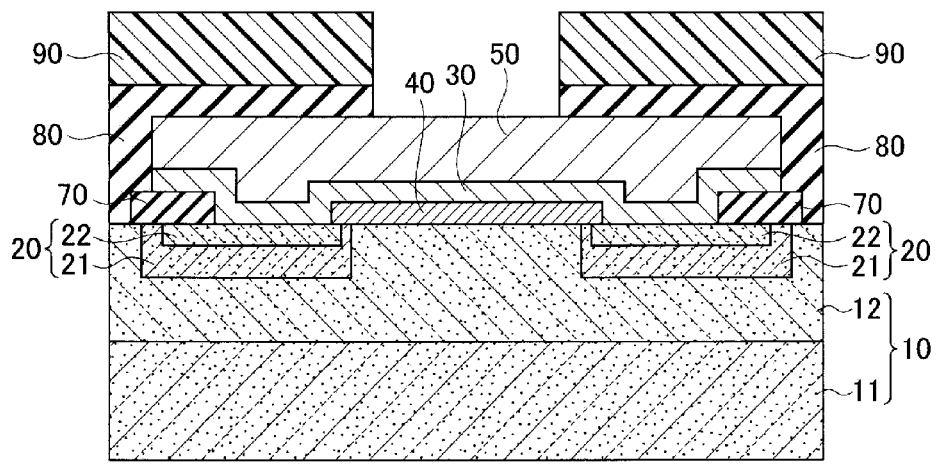
FIG. 12 is a schematic cross-sectional view for explaining a seventh process of the method of manufacturing the semiconductor device according to the first embodiment of this disclosure.

Next, as shown in FIG. 11, an ohmic metal layer 300 to be the ohmic junction electrode 30 is formed so as to be in contact with the exposed front surface of the highly-doped p-type region 22. As the ohmic junction electrode 30, a two-layer structure as shown in FIG. 2 can be used. For example, an Ni layer with a film thickness of 50 nm to 200 nm is formed as the first diffusion barrier metal layer 31, and then a Ti film with a film thickness of 50 nm to 200 nm is formed as the second diffusion barrier metal layer 32. Next, on the ohmic metal layer 300, an Al film with a film thickness of 1 μm to 10 μm is formed as a pad electrode 500. The ohmic metal layer 300 or the pad electrode 500 is formed, for example, by a sputtering method, an electron-beam deposition method, or the like.

Next, the pad electrode 500 is patterned by a photolithography technique and a wet or dry etching technique, whereby the pad electrode 50 is formed. Further, the ohmic metal layer 300 is similarly patterned, whereby the ohmic junction electrode 30 is formed. In this case, the pad electrode 500 and the ohmic metal layer 300 may be continuously etched by the same photomask, or each may be patterned by a photolithography technique and an etching technique.

Next, as a first protective film 80, an SiN film, an NSG film, or a PSG film is formed on the semiconductor substrate 10 so as to have a film thickness of 100 nm to 2 μm by a CVD method. Further, as a second protective film 90, a polyimide film is formed on the first protective film 80. Thereafter, a hole is formed in the second protective film 90 on the Schottky junction electrode 40 by a photolithography technique, and then a hole is formed in the first protective film 80 by dry etching using the second protective film 90 as a mask. As a result, the front surface of the pad electrode 50 is exposed, whereby it becomes possible to electrically connect the pad electrode 50 as the anode electrode of the semiconductor device 1 to the outside.

Figure 13:
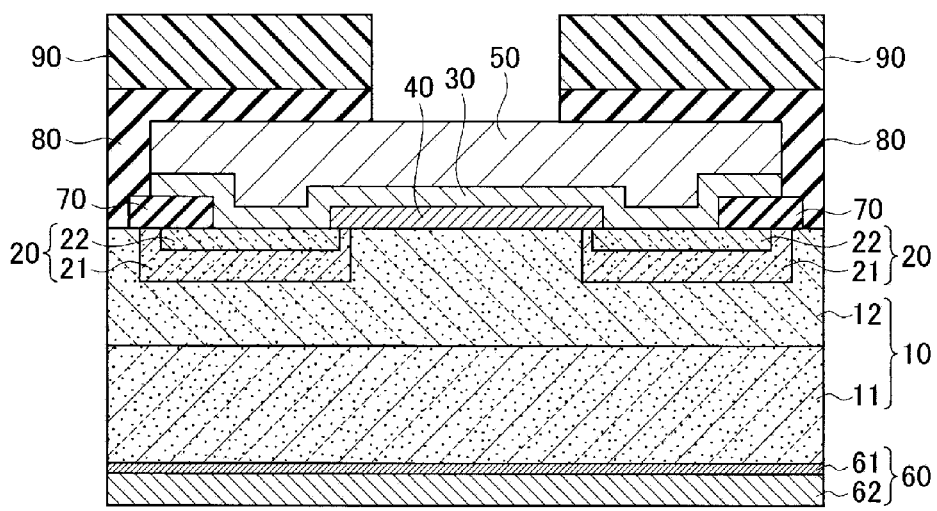
FIG. 13 is a schematic cross-sectional view for explaining an eighth process of the method of manufacturing the semiconductor device according to the first embodiment of this disclosure.

Next, on the bottom surface of the semiconductor device 1, the rear surface electrode 60 is formed. The front surface of the semiconductor substrate 10 is protected by a photoresist film, protective tape, or the like, and the oxide film of the rear side of the semiconductor device 1 is removed by wet etching, dry etching, grinding, polishing, or the like. Thereafter, on the rear surface of the semiconductor substrate 10 subjected to the oxide film removal, an Ni film is formed by a sputtering method, an electron-beam deposition method, or the like. Next, the rear surface of the semiconductor substrate 10 is reacted with an Ni film formed by a laser annealing method, whereby an Ni silicide film to act as a rear surface ohmic junction electrode is formed as the first rear surface metal layer 61. As a result, the rear surface of the semiconductor substrate 10 and the Ni silicide film form an ohmic junction. Next, a passive layer formed on the Ni silicide film is removed by reverse sputtering and dry etching, and then the second rear surface metal layer 62 is made of Ti, Ni, Ag, Au, Pd, and the like on the front surface of the first rear surface metal layer 61. As a result, the rear surface electrode 60 as shown in FIG. 13 is formed, whereby it becomes possible to electrically connect the rear surface electrode as the cathode electrode of the semiconductor device 1 to the outside.

Also, the Ni silicide film to act the rear seat ohmic junction electrode can also be formed by heat treatment such as a rapid thermal annealing (RTA) process. In this case, the thermal oxide film of the interlayer insulating film 70 is formed, or the thermal oxide film and the CVD oxide film are formed, and then Ni silicide film is formed before the process of exposing the upper surface of the active area 100. For example, the front surface of the semiconductor substrate 10 is protected by a photoresist film or the like, and on the rear surface of the semiconductor substrate 10 subjected to the oxide film removal by wet etching, the Ni film is formed by a sputtering method or an electron-beam deposition method, and heat treatment is performed at 900° C. to 1050° C. in an inert atmosphere or an reducing atmosphere for 2 minutes to 10 minutes. After the heat treatment, Ni which did not contribute to the siliciding reaction is removed by wet etching such that only the formed Ni silicide film remains on the rear surface of the semiconductor substrate 10. After the front surface structure is formed, the passive layer formed on the Ni silicide film is removed by reverse sputtering treatment and wet etching. Thereafter, the second rear surface metal layer 62 is made of Ti, Ni, Ag, Au, Pd, and the like on the front surface of the Ni silicide film by a sputtering method, an electron-beam deposition method, or the like. As a result, the rear surface electrode 60 as shown in FIG. 13 is formed, whereby it becomes possible to electrically connect the rear surface electrode as the cathode electrode of the semiconductor device 1 to the outside.

In the above described way, the semiconductor device 1 is completed. According to the method of manufacturing the semiconductor device 1 as described above, the highly-doped p-type region 22 of the guard ring 20 and the ohmic junction electrode 30 can form an ohmic junction. Therefore, minority carrier injection from the PN junction formed between the guard ring 20 and the drift region causes conductivity modulation in the drift region. The conductivity modulation reduces the series resistance, whereby it is possible to suppress the voltage from rising during application of a high current. That is, it is possible to provide the semiconductor device 1 having improved forward surge current withstand.

Also, in the above described manufacturing method, a manufacturing process condition can be controlled such that the outermost surface of the highly-doped p-type region 22 is always exposed in a concentration necessary to form an ohmic junction, whereby it is possible to form an ohmic junction only by bringing the highly-doped p-type region 22 in contact with the ohmic junction electrode 30. Therefore, high-temperature heat treatment is unnecessary, and thus after the Schottky junction electrode 40 is formed, it is possible to form the ohmic junction electrode 30. Therefore, unlike a case of forming the ohmic junction electrode 30 before formation of the Schottky junction electrode 40, it is possible to suppress the Schottky junction interface from being contaminated due to dispersion of a metal configuring the ohmic junction electrode 30 caused by pre-processing or the like during formation of the Schottky junction electrode 40, and it is possible to obtain stable SBD characteristics.

Second Embodiment

In the first embodiment, a case where the semiconductor element which is formed in the element region 101 of the semiconductor device 1 is a SBD has been described. However, the semiconductor element is not limited to the SBD.

Figure 14:
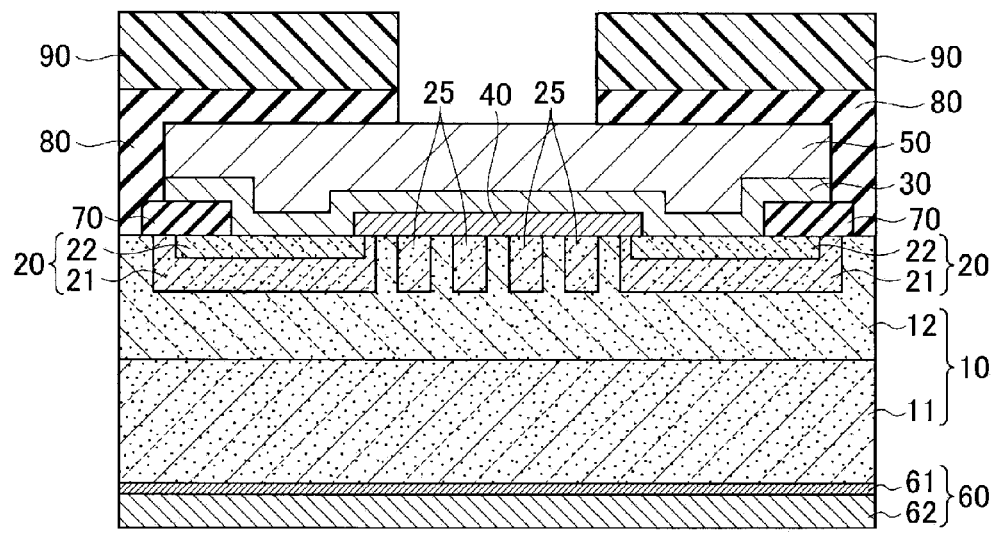
FIG. 14 is a cross-sectional view schematically illustrating a configuration of a semiconductor device according to a second embodiment of this disclosure.
Figure 15:
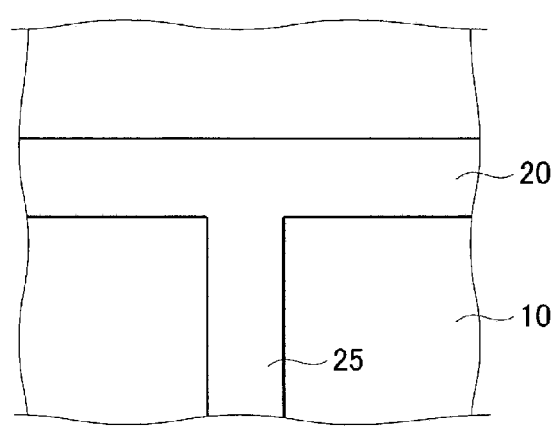
FIG. 15 is a plan view schematically illustrating the configuration of the semiconductor device according to the second embodiment of this disclosure.

For example, even in a case where a semiconductor element having a junk barrier Schottky diode (JBS) structure, in which a p-type region is formed in a Schottky barrier region of a SBD, is formed in the element region 101 as shown in FIG. 14, this disclosure is effective. In the JBS structure, inside the element region 101, p-type regions 25 are disposed at regular intervals. During application of a reverse voltage, depletion layers which are formed at the junctions of the p-type regions 25 and the n-type drift region expand, whereby neighboring depletion layers formed at the junctions of the p-type regions 25 and the n-type drift region are connected. Therefore, the current path of the drift region is completely blocked, whereby a high breakdown voltage is obtained. Typically, carriers which move during application of a reverse voltage are discharged during a forward operation. However, in a case of an SiC, barriers are formed between the p-type regions 25 and the Schottky junction electrode 40, whereby movement of carriers are blocked. Therefore, some carriers remain at the junctions without being discharged. As a result, even during a forward operation, the depletion layers formed during application of a reverse voltage do not dissipate and spatially narrow the drift region and thus may raise the forward voltage. For this reason, in portions of the p-type regions 25 of the JBS structure, portions to form ohmic junctions with the ohmic junction electrode 30 are provided to make it possible to discharge carriers. For example, in a case where the p-type regions 25 are disposed in a shape in which a plurality of stripes extends from one end to the other end of the element region 101 as seen in a plan view, at least one end of each stripe is connected to the guard ring 20 as illustrated in FIG. 15. As a result, the p-type regions 25 are always connected to the ohmic junction electrode 30 to form an ohmic junction with the highly-doped p-type region 22 provided in the guard ring 20, via the guard ring 20. Therefore, it is possible to smoothly discharge carrier stored in the junctions.

Figure 16:
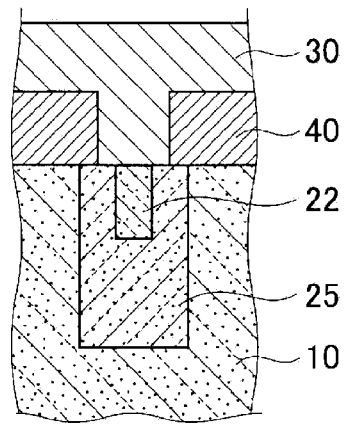
FIG. 16 is a cross-sectional view schematically illustrating another configuration of the semiconductor device according to the second embodiment of this disclosure.
Figure 17:
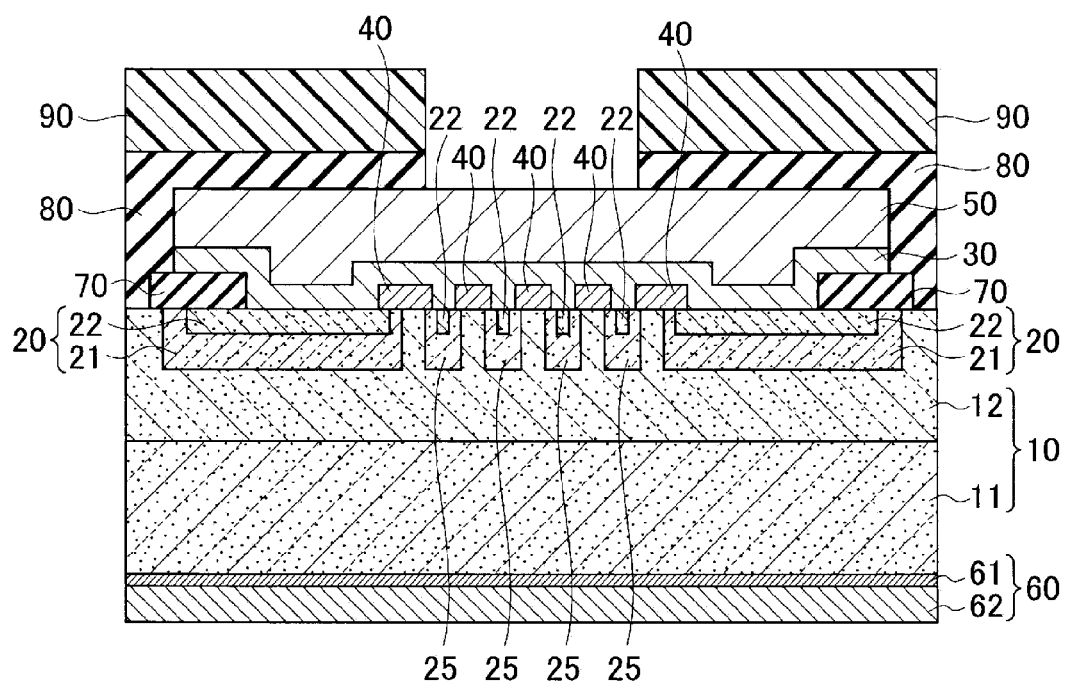
FIG. 17 is a cross-sectional view schematically illustrating a configuration of a semiconductor device according to a third embodiment of this disclosure.

Also, in a case where the p-type regions 25 are disposed as a plurality of separate islands, highly-doped p-type regions 22 are formed at the inner side of the p-type regions 25 as shown in FIG. 16. Thereafter, the Schottky junction electrode 40 is patterned such that the highly-doped p-type regions 22 are exposed from the front surface of the semiconductor substrate 10, and the ohmic junction electrode 30 is disposed so as to be in contact with the highly-doped p-type regions 22. As a result, each p-type region 25 can form an ohmic junction with the ohmic junction electrode 30.

In manufacturing the semiconductor device 1 according to the second embodiment, in a case of performing impurity implantation configuring the guard ring 20 and the p-type regions 25, an implantation through oxide film is formed on the semiconductor layer 12 of the semiconductor substrate 10, and an ion implantation mask having implementation holes is formed by a photoresist film. Also, according to characteristics required for the semiconductor device 1, the implantation conditions of the guard ring 20 and the p-type regions 25 are separately set. In this case, ion implantation mask formation and ion implantation are separately performed, or are performed partially by a common process. Also, in a case where the p-type regions 25 are disposed as a plurality of islands, the highly-doped p-type regions 22 are provided inside the p-type regions 25, respectively, such that the highly-doped p-type regions 22 are not in direct contact with the n-type drift region. Also, either of impurity implantation of the guard ring 20 and impurity implantation of the p-type regions 25 and the highly-doped p-type regions 22 may be performed first.

Third Embodiment

Even in a case where a Merged PIN/Schottky (MPS) structure having both of a Schottky junction and a PN junction is formed in the element region 101 by adding a PN junction region to a SBD, this disclosure is effective. In a case of a diode of the MPS structure, if a high forward current is applied, whereby a forward voltage rises, a PIN diode operates. Therefore, it is possible to positively use conductivity modulation of the drift region due to minority carrier injection from the PN junction, thereby suppressing the forward voltage from rising. That is, it is possible to improve forward surge current withstand. Also, the MPS uses the above described effect and is used even as a device structure of a high current specification.

In a case of configuring an MPS, electrodes to be connected to p-type regions 25 are formed separately from Schottky junction electrodes 40. As regions where the electrodes to be connected to the p-type regions 25 are disposed, highly-doped p-type regions 22 are formed at the inner side of the p-type regions 25. Each Schottky junction electrode 40 is formed in a SBD region of the semiconductor layer 12 such that an edge portion of the Schottky junction electrode 40 is positioned between an edge portion of a corresponding p-type region 25 and a highly-doped p-type region 22 formed in the corresponding p-type region 25. In this way, Schottky junction interfaces are completely covered by the Schottky junction electrodes 40. Subsequently, the ohmic junction electrode 30 is formed such that the ohmic junction electrode 30 and the highly-doped p-type regions 22 form ohmic junctions between the Schottky junction electrodes 40. As a result, the ohmic junction electrode 30 becomes an electrode which is connected to the p-type regions 25 of the PIN diode. Therefore, it becomes possible to operate the PIN diode.

In manufacturing the semiconductor device 1 according to the third embodiment, in a case of performing impurity implantation configuring the guard ring 20 and the p-type regions 25, an implantation through oxide film is formed on the semiconductor layer 12 of the semiconductor substrate 10, and an ion implantation mask having implementation holes is formed by a photoresist film. Also, according to characteristics required for the semiconductor device 1, the implantation conditions of the guard ring 20 and the p-type regions 25 are separately set. In this case, ion implantation mask formation and ion implantation are separately performed, or are performed partially by a common process. Also, in a case where the p-type regions 25 are disposed as a plurality of islands, the highly-doped p-type regions 22 are provided inside the p-type regions 25, respectively, such that the highly-doped p-type regions 22 are not in direct contact with the n-type drift region. Also, either of impurity implantation of the guard ring 20 and impurity implantation of the p-type regions 25 and the highly-doped p-type regions 22 may be performed first.

As described above, even though the contact electrodes of the p-type regions 25 of the PIN diode of the MPS structure are separately formed, it is possible to form ohmic junctions in the p-type regions 25. As a result, it is possible to simplify the manufacturing process. Also, it is possible to suppress contamination of a Schottky junction interface during formation of the contact electrodes of the p-type regions 25.

Other Embodiments

Although this disclosure has been described with the embodiment provided above, the description and drawings form a portion of this disclosure and are not to be understood as limiting the invention. From this disclosure, various substitutions, embodiments, and operation techniques will be apparent to those skilled in the art.

For example, although a case where the semiconductor substrate 10 is formed of SiC has been described, the semiconductor substrate 10 may be formed of any other material such as silicon (Si).

As described above, it is obvious that this disclosure includes various embodiments not described here. Therefore, the technical scope of this disclosure is determined only by the features of the invention according to claims proper from the above explanation.

What is claimed is:

1. A semiconductor device comprising:
   an n-type semiconductor substrate, which has a main surface having an element region and an outer peripheral region surrounding the element region;
   a p-type guard ring, which includes:
      a lowly-doped p-type region disposed on an upper surface of the semiconductor substrate in the outer peripheral region surrounding the element region; and
      a highly-doped p-type region disposed on an inner side of the lowly-doped p-type region and having an impurity concentration higher than an impurity concentration of the lowly-doped p-type region,
   wherein a side surface and a bottom surface of the highly-doped p-type region are covered by the lowly-doped p-type region such that the highly-doped p-type region is not in contact with the n-type region of the semiconductor substrate;
   an ohmic junction electrode, which forms an ohmic junction with the highly-doped p-type region; and
   a Schottky junction electrode, which is disposed on the upper surface of the element region and forms a Schottky junction with the semiconductor substrate, wherein the ohmic junction electrode is disposed on the upper surface of the Schottky junction electrode.

2. The semiconductor device according to claim 1, wherein the semiconductor substrate is made of silicon carbide.

3. The semiconductor device according to claim 1, further comprising:
   a pad electrode, which is disposed on the upper surface of the ohmic junction electrode,
   wherein the ohmic junction electrode includes:
      a first diffusion barrier metal layer that is disposed on the upper surface of the Schottky junction electrode and suppresses diffusion of a metal configuring the Schottky junction electrode; and
      a second diffusion barrier metal layer that is disposed on the first diffusion barrier metal layer and suppresses diffusion of a metal configuring the pad electrode.

4. The semiconductor device according to claim 1, further comprising:
   a rear surface electrode, which is disposed on another main surface of the semiconductor substrate facing the main surface where the Schottky junction electrode is disposed,
   wherein a Schottky barrier diode is formed in the element region.

5. The semiconductor device according to claim 1, further comprising:
   an interlayer insulating film that is disposed in an outer edge portion of the outer peripheral region so as to surround the element region,
   wherein the ohmic junction electrode is formed continuously over the upper surface of the highly-doped p-type region and the side surface and upper surface of the interlayer insulating film.

6. The semiconductor device according to claim 5, wherein the outer edge portion of the ohmic junction electrode is positioned on the inner side of the outer edge portion of the p-type guard ring on the upper surface of the interlayer insulating film as viewed in a plan view.

* * * * *